(12) United States Patent
Huyet et al.

(10) Patent No.: US 11,742,817 B2
(45) Date of Patent: Aug. 29, 2023

(54) PROCESS FOR TRANSFERRING A THIN LAYER TO A SUPPORT SUBSTRATE THAT HAVE DIFFERENT THERMAL EXPANSION COEFFICIENTS

(71) Applicant: Soitec, Bernin (FR)

(72) Inventors: Isabelle Huyet, Crolles (FR); Cedric Charles-Alfred, Grenoble (FR); Didier Landru, Le Champ-près-Froges (FR); Alexis Drouin, La Buissiere (FR)

(73) Assignee: Soitec, Bernin (FR)

( * ) Notice: Subject to any disclaimer, the term of this patent is extended or adjusted under 35 U.S.C. 154(b) by 473 days.

(21) Appl. No.: 16/618,696

(22) PCT Filed: Jun. 21, 2018

(86) PCT No.: PCT/EP2018/066552
§ 371 (c)(1),
(2) Date: Dec. 2, 2019

(87) PCT Pub. No.: WO2019/002080
PCT Pub. Date: Jan. 3, 2019

(65) Prior Publication Data
US 2020/0186117 A1 Jun. 11, 2020

(30) Foreign Application Priority Data
Jun. 30, 2017 (FR) ...................................... 1756116

(51) Int. Cl.
*H01L 21/02* (2006.01)
*H03H 3/10* (2006.01)
(Continued)

(52) U.S. Cl.
CPC ............ *H03H 3/10* (2013.01); *H10N 30/072* (2023.02); *H10N 30/8536* (2023.02);
(Continued)

(58) Field of Classification Search
CPC ......... H01L 21/02365; H01L 21/02436; H01L 21/02499; H01L 21/02505
See application file for complete search history.

(56) References Cited

U.S. PATENT DOCUMENTS 6,190,998 B1   2/2001   Bruel et al.
6,593,212 B1   7/2003   Kub et al.
(Continued)

FOREIGN PATENT DOCUMENTS

FR   2856192 A1   12/2004
FR   2914492 A1   10/2008
(Continued)

OTHER PUBLICATIONS

International Search Report for International Application No. PCT/FR2018/066552 dated Sep. 17, 2018, 2 pages.
(Continued)

*Primary Examiner* — Jae Lee
(74) *Attorney, Agent, or Firm* — TraskBritt

(57) ABSTRACT

A process for transferring a thin layer consisting of a first material to a support substrate consisting of a second material having a different thermal expansion coefficient, comprises providing a donor substrate composed of an assembly of a thick layer formed of the first material and of a handle substrate having a thermal expansion coefficient similar to that of the support substrate, and the donor substrate having a main face on the side of the thick layer introducing light species into the thick layer to generate a plane of weakness therein and to define the thin layer between the plane of weakness and the main face of the donor substrate; assembling the main face of the donor substrate with a face of the support substrate; and detachment of the thin layer at the plane of weakness, the detachment comprising application of a heat treatment.

17 Claims, 1 Drawing Sheet

(51) Int. Cl.
*H10N 30/072* (2023.01)
*H10N 30/853* (2023.01)

(52) U.S. Cl.
CPC ..... *H10N 30/8542* (2023.02); *H10N 30/8548* (2023.02); *H10N 30/8554* (2023.02)

(56) References Cited

U.S. PATENT DOCUMENTS

| 10,727,396 | B2 | 7/2020 | Akiyama et al. |
| 2003/0186521 | A1 | 10/2003 | Kub et al. |
| 2004/0262686 | A1 | 12/2004 | Shaheen et al. |
| 2007/0022940 | A1* | 2/2007 | Boussagol ........ H01L 21/76254 117/1 |
| 2009/0221131 | A1* | 9/2009 | Kubota ............... C30B 29/40 438/478 |
| 2011/0192343 | A1* | 8/2011 | Abir ................. H01L 21/76254 117/106 |
| 2012/0329243 | A1* | 12/2012 | Letertre ........... H01L 21/76254 438/758 |

FOREIGN PATENT DOCUMENTS

| FR | 3007892 B1 | 7/2015 |
| JP | 2003-224042 A | 8/2003 |
| JP | 2006-007861 A | 1/2006 |
| JP | 2012-509581 A | 12/2012 |
| JP | 2016-225538 | 12/2016 |
| KR | 10-2009-0093887 A | 9/2009 |
| WO | 2017/068270 A1 | 4/2017 |

OTHER PUBLICATIONS

International Written Opinion for International Application No. PCT/FR2018/066552 dated Sep. 17, 2018, 5 pages.
Japanese Notice of Reasons for Rejections for Application No. 2019-568021 dated Jul. 19, 2022, 5 pages.
Korean Office Action for Application No. 10-2020-7000833 dated Dec. 14, 2022, 12 pages with translation.
Japanese Final Rejection for Application No. 2019-568021 dated Feb. 7, 2023, 4 pages.
Chinese Second Office Action for Application No. 201880041487.4 dated Jun. 7, 2023, 7 pages.
Chinese Office Action for Application No. 201880041487.4 dated Mar. 14, 2023, 11 pages.

* cited by examiner

PROCESS FOR TRANSFERRING A THIN LAYER TO A SUPPORT SUBSTRATE THAT HAVE DIFFERENT THERMAL EXPANSION COEFFICIENTS

CROSS-REFERENCE TO RELATED APPLICATIONS

This application is a national phase entry under 35 U.S.C. § 371 of International Patent Application PCT/EP2018/066552, filed Jun. 21, 2018, designating the United States of America and published as International Patent Publication WO 2019/002080 A1 on Jan. 3, 2019, which claims the benefit under Article 8 of the Patent Cooperation Treaty to French Patent Application Serial No. 1756116, filed Jun. 30, 2017.

TECHNICAL FIELD

The present disclosure relates to the field of heterogeneous structures, combining two substrates that have different coefficients of thermal expansion. More particularly, the present disclosure relates to a process for transferring a thin layer onto a support substrate. This manufacturing process is used, for example, in the fields of microelectronics, micromechanics, photonics, etc.

BACKGROUND

Various processes for forming a thin layer on a support substrate are known from the prior art. Such processes may be, for example, molecular beam epitaxy, plasma sputtering, plasma deposition (laser pulsed deposition) or application of the Smart Cut™ technology in which a thin layer is taken from a bulk substrate by fracturing at a fragile zone (or embrittlement plane) formed in the bulk substrate by implantation of light species.

The present disclosure more particularly relates to the formation of a thin layer made of ferroelectric material obtained by applying such a process, as is taught in FR 2 914 492.

Application of the Smart Cut™ process is particularly suited to the case where the material of the thin layer that it is desired to transfer has a coefficient of thermal expansion similar to that of the support substrate onto which the transfer takes place.

In the opposite case, the temperature to which the assembly formed from the support substrate and the donor substrate may be subjected is limited. Thus, FR 2 856 192 recalls that a heat treatment above a temperature determined by the value of the coefficients of thermal expansion of the materials may lead to uncontrolled fracturing of one of the substrates and/or to peeling of the donor substrate or of the thin layer. This poses a problem since the Smart Cut™ process may make it necessary to perform at least one heat treatment at a sufficient temperature in order, for example, to reinforce the adhesion of the donor substrate to the support substrate, or to facilitate the fracture of the donor substrate on the embrittlement plane.

BRIEF SUMMARY

One aim of the present disclosure is to propose a process for transferring a thin layer consisting of a first material onto a support substrate consisting of a second material, the first and the second materials having different coefficients of thermal expansion, which at least partly addresses the abovementioned problem. It notably finds its application in transferring a thin layer made of ferroelectric material onto a support having a coefficient of expansion different from that of the material of which this thin layer is composed, for example, a support substrate made of silicon.

For the purpose of achieving one of these aims, the subject of the present disclosure proposes a process for transferring a thin layer consisting of a first material onto a support substrate consisting of a second material, the first and the second materials having different coefficients of thermal expansion. According to the present disclosure, the process for transferring the thin layer includes the provision of a donor substrate composed of the assembly of a thick layer formed from the first material and from a handling substrate, the coefficient of thermal expansion of the handling substrate being similar to that of the support substrate and the donor substrate having a main face on the thick layer side; the introduction of light species into the thick layer to generate an embrittlement plane therein and to define the thin layer between the embrittlement plane and the main face of the donor substrate; the assembly of the main face of the donor substrate with one face of the support substrate; detachment of the thin layer from the embrittlement plane, the detachment comprising the application of a heat treatment.

The assembly formed from the donor substrate and the support may be exposed to a much higher temperature than that applied in the context of a "direct" approach in accordance with the prior art, according to which the donor substrate does not include any handling substrate, without risk of uncontrolled fracture of one of the substrates or peeling of the donor substrate or of the thin layer. The balanced structure, in terms of coefficient of thermal expansion of this assembly, notably makes it possible to facilitate the step of detachment of the thin layer by exposing the assembly to a relatively high temperature.

According to other advantageous and non-limiting characteristics of the present disclosure, taken alone or in any technically feasible combination:
- the coefficient of thermal expansion of the first material constituting the thick layer and that of the second material constituting the support substrate differ by at least 10% at room temperature;
- the difference in coefficient of thermal expansion of the constituent of the handling substrate and of that of the support is less, as an absolute value, than the difference in thermal expansion of the thick layer and of that of the support substrate;
- the light species implanted are hydrogen ions and/or helium ions;
- the first material is a ferroelectric material such as $LiTaO_3$, $LiNbO_3$, $LiAlO_3$, $BaTiO_3$, $PbZrTiO_3$, $KNbO_3$, $BaZrO_3$, $CaTiO_3$, $PbTiO_3$ or $KTaO_3$;
- the material of the support substrate is silicon;
- the handling substrate is of the same nature as the support substrate;
- the handling substrate has a thickness equivalent to that of the support substrate;
- the thick layer has a thickness of between 10 and 400 micrometers to enable sampling of one or more thin layers;
- the donor substrate is obtained by bonding a source substrate and the handling substrate;
- the bonding is obtained by molecular adhesion;
- a step of thinning the source substrate is included to provide the thick layer;

the thinning step is performed by milling and/or chemical-mechanical polishing (CMP) and/or etching.

BRIEF DESCRIPTION OF THE DRAWINGS

Other features and advantages of embodiments of the present disclosure will become apparent from the following detailed description of embodiments of the present disclosure, which description is given with reference to the appended figures, in which.

DETAILED DESCRIPTION

For the sake of keeping the following description simple, the same references are used for identical elements or for elements performing the same function in the prior art or in the various presented embodiments of the process.

The figures are schematic representations that, for the sake of legibility, are not to scale. In particular, the thicknesses of the layers are not to scale with respect to the lateral dimensions of these layers.

The term "coefficient of thermal expansion" used in the rest of this description in relation to a layer or a substrate makes reference to the coefficient of expansion in a defined direction in the main plane defining this layer or this substrate. If the material is anisotropic, the coefficient value retained will be that of largest amplitude. The coefficient value is that measured at room temperature.

The present disclosure relates to a process for transferring a thin layer 3 consisting of a first material onto a support substrate 7 consisting of a second material, the first and the second materials having different coefficients of thermal expansion. The term "different" means that these coefficients differ by at least 10%.

In the context of this description, it will be considered, by way of example, that the thin layer 3 is made of ferroelectric material and the support substrate 7 is made of silicon (the coefficient of thermal expansion of which is estimated as $2.6 \times 10^{-6}$ $K^{-1}$).

It is recalled that a ferroelectric material is a material that has an electrical polarization in the natural state, it being possible for this polarization to be reversed by applying an external electric field. The ferroelectric domain refers to each continuous region of the material in which the polarization is uniform (all the dipole moments are aligned parallel to each other in a given direction). A ferroelectric material may thus be characterized as a "monodomain" in the case where this material consists of a single region in which the polarization is uniform or a "multidomain" in the case where the ferroelectric material comprises a plurality of regions having polarities that may be different.

In general, it is generally desirable to have a ferroelectric thin layer of monodomain nature.

Figure 1:
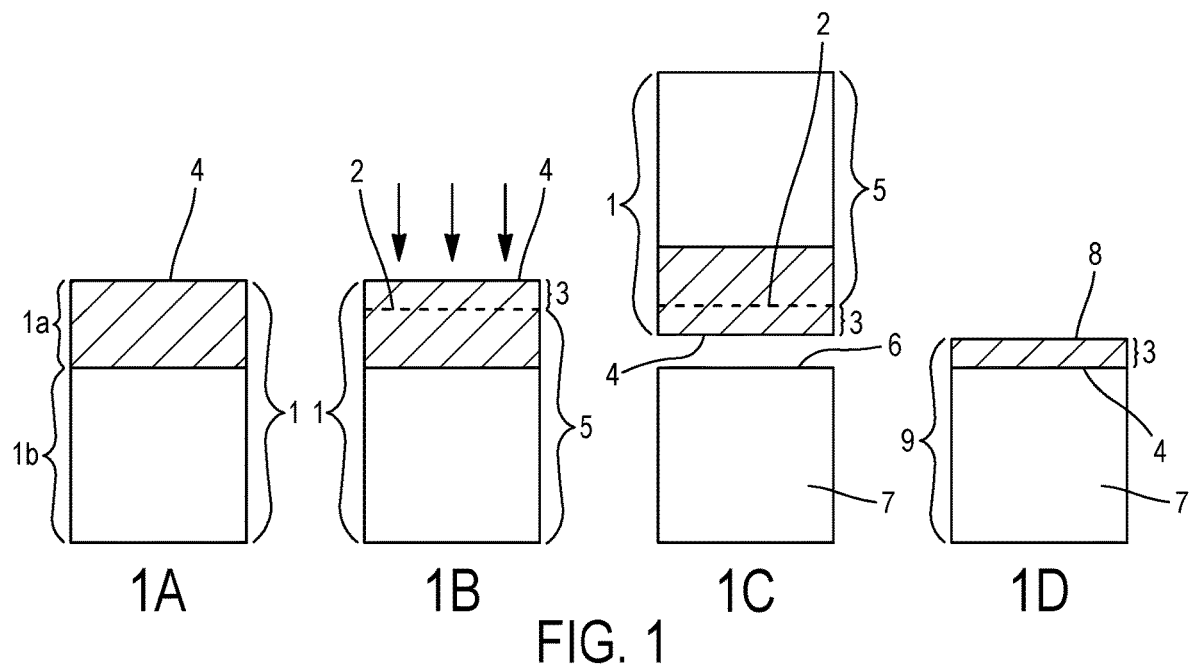
FIGS. 1A to 1D show an embodiment of a process in accordance with the present disclosure.

With reference to FIG. 1A, the donor substrate 1 is composed of a thick layer of ferroelectric material 1a, for example, of $LiTaO_3$ ($2 \times 10^{-6}$ $K^{-1}$ (z), $16 \times 10^{-6}$ $K^{-1}$ (x, y)), $LiNbO_3$, $LiAlO_3$, $BaTiO_3$, $PbZrTiO_3$, $KNbO_3$, $BaZrO_3$, $CaTiO_3$, $PbTiO_3$ or $KTaO_3$ and of a handling substrate 1b. The donor substrate 1 may take the form of a circular wafer of standardized size, for example, of 150 mm or 200 mm in diameter. However, the present disclosure is not in any way limited to these dimensions or to this form. The thick layer of ferroelectric material 1a may have been sampled from an ingot of ferroelectric material, this sampling having been performed so that the thick layer 1a has a predetermined crystalline orientation. The orientation is chosen as a function of the intended application. Thus, it is common practice to choose an orientation 42° RY in the case where it is desired to exploit the properties of the thin layer to form a SAW filter. However, the present disclosure is not in any way limited to a particular crystalline orientation.

The handling substrate 1b advantageously consists of a material (or of a plurality of materials) giving it a coefficient of thermal expansion close to that of which the support substrate 7 is composed. The term "close" means that the difference in coefficient of thermal expansion of the handling substrate 1b and of that of the support substrate 7 is less, as an absolute value, than the difference in thermal expansion of the thick layer of ferroelectric material 1a and of that of the support substrate 7.

Preferentially, the handling substrate 1b and the support substrate have an identical coefficient of thermal expansion. During the assembly of the donor substrate 1 and of the support substrate 7, a structure is formed that is capable of withstanding a heat treatment at a relatively high temperature. For the sake of ease of implementation, this may be obtained by selecting the handling substrate 1b so that it consists of the same material as that of the support substrate 7.

Figure 2:
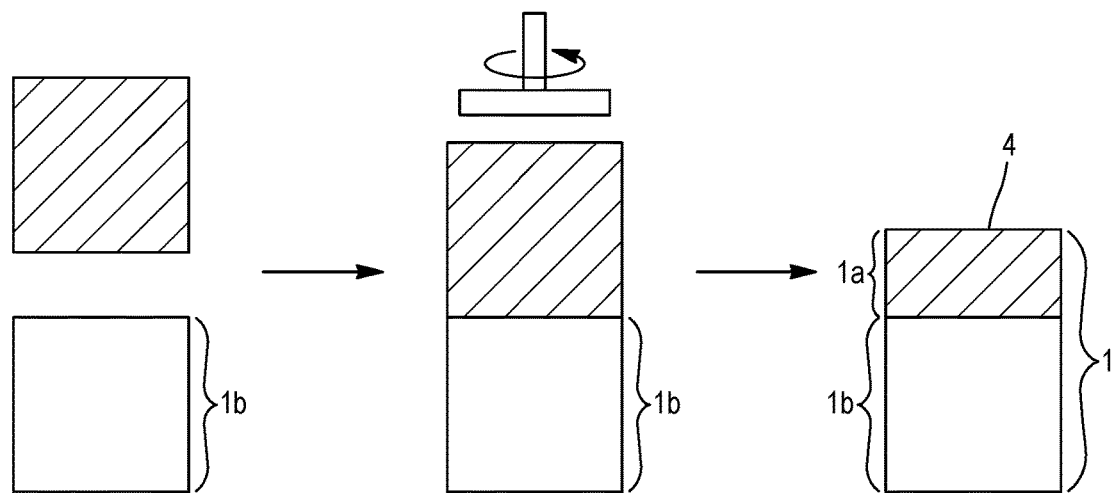
FIG. 2 schematically represents a process for forming a donor substrate in accordance with the present disclosure.

To form the donor substrate 1, a bulk block of ferroelectric material is preassembled with the handling substrate 1b, for example, by means of a molecular adhesive bonding technique. Next, the layer of ferroelectric material 1a is formed by thinning, for example, by milling and/or chemical-mechanical polishing and/or etching. This process is presented schematically in FIG. 2. Before assembling, an adhesion layer may be formed (for example, by deposition of silicon oxide and/or silicon nitride) on one and/or another of the faces placed in contact during the assembling. The assembling may comprise the application of a low-temperature heat treatment (for example, between 50 and 300° C., typically 100° C.) making it possible to strengthen the bonding energy sufficiently to allow the following step of thinning.

The handling substrate 1b may be chosen to have a thickness substantially equivalent to that of the support substrate 7. The thinning step is performed such that the thick layer 1a has a thickness that is small enough for the stresses generated during the heat treatments applied in the rest of the process to be of reduced intensity. At the same time, this thickness is large enough to be able to sample the thin layer 3 or a plurality of such layers therefrom. This thickness may be, for example, between 5 and 400 microns.

The process comprises the introduction into the donor substrate 1 of at least one light atomic or ionic species. This introduction may correspond to an implantation, i.e., ion bombardment of the main face 4 of the donor substrate 1 with light elemental species such as hydrogen and/or helium ions.

In a manner known per se, and as is represented in FIG. 1B, the implanted ions have the role of forming an embrittlement plane 2 delimiting a thin layer 3 of ferroelectric material to be transferred, which is located on the main face 4 side and another part 5 constituting the rest of the substrate.

The nature, the dose of the implanted species and the implantation energy are chosen as a function of the thickness of the layer that it is desired to transfer and of the physico-chemical properties of the donor substrate. In the case of a donor substrate 1 made of $LiTaO_3$, it may thus be chosen to implant a dose of hydrogen of between $1^E16$ and $5^E17$ at/cm$^2$ with an energy of between 30 and 300 keV to delimit a thin layer 3 of the order of 200 to 2000 nm.

In a following step, represented in FIG. 1C, the main face 4 of the donor substrate 1 is assembled with one face 6 of a support substrate 7. The support substrate 7 may have the same dimensions and the same shape as those of the donor substrate. For reasons of availability and cost, the support substrate 7 is a monocrystalline or polycrystalline silicon wafer. However, more generally, the support substrate 7 may consist of any material, for example, silicon, sapphire or glass, and may have any shape.

Prior to this step, it may be envisaged to prepare the faces of the substrates to be assembled via a step of cleaning, brushing, drying, polishing or plasma activation.

The assembling step may correspond to placing the donor substrate 1 in intimate contact with the support substrate 7 by molecular adhesion and/or electrostatic bonding. Optionally, to facilitate the assembling of the donor substrate 1 and support substrate 7, notably when they are assembled by direct bonding, at least one intermediate layer may be formed prior to the assembling, either on the main face 4 of the donor substrate 1, or on the flat face 6 to be assembled of the support substrate 7, or on both. This intermediate layer consists, for example, of silicon oxide, silicon nitride or polycrystalline silicon and has a thickness of between a few nanometers and a few microns. The intermediate layer may be produced according to the various techniques known in the prior art, such as oxidation or nitridation heat treatments, chemical depositions (PECVD, LPCVD, etc.), etc.

On conclusion of this assembling step, the assembly represented in FIG. 1C is obtained, comprising the donor substrate 1 and the support substrate 7, the flat face 6 of the support substrate 7 adhering to the main face 4 of the donor substrate 1.

The assembly is then treated to detach the thin layer 3 of ferroelectric material from the donor substrate 1, for example, by cleavage along the embrittlement plane 2.

This detachment step may thus comprise the application to the assembly of a heat treatment in a temperature range on the order of 80° C. to 500° C. to allow the transfer of the thin layer 3 onto the support substrate 7. In addition to the heat treatment, this step may comprise the application of a blade or jet of gaseous or liquid fluid to the embrittlement plane 2. In the case of a ferroelectric material, care will be taken not to exceed its Curie temperature, so as not to deteriorate the characteristics of the thin layer.

Following this detachment step, the structure 9 represented in FIG. 1D is obtained. This structure 9 comprises the thin layer 3 of ferroelectric material comprising a first free face 8 and its main face 4 arranged on the support substrate 7.

The assembly formed from the donor substrate 1 and the support substrate 7 may be exposed to a much higher temperature than that applied in the context of a "direct" approach in accordance with the prior art, according to which the donor substrate does not include any handling substrate, without risk of uncontrolled fracture of one of the substrates or peeling of the donor substrate 1 or of the thin layer 3. The balanced structure, in terms of coefficient of thermal expansion of this assembly, thus makes it possible to facilitate the step of detachment of the thin layer 3 by exposing the assembly to a relatively high temperature, for example, of between 80° C. and 500° C.

It is then possible to perform a step of finishing of the thin layer 3 and notably of its free face 8 in order to restore and/or improve the desired properties of this thin layer 3. As is well known per se, this finishing may comprise polishing, etching, sacrificial oxidation, or annealing under a neutral or reductive or oxidizing atmosphere.

In the context of the example that has just been presented, and in which the thin layer 3 is made of ferroelectric material, this finishing step may correspond to a heat treatment of the thin layer 3 followed by polishing, this sequence making it possible to restore the initial monodomain properties, which the thick layer of ferroelectric material 1a had, for example, following an orientation of 42° RY, on the thin layer 3 after transfer. However, the present disclosure is not in any way limited to a particular finishing sequence.

The heat treatment makes it possible to correct crystalline defects present in the thin layer 3. In addition, it contributes toward consolidating the bonding between the thin layer 3 and the support substrate 7. The heat treatment brings the structure to a temperature of between 300° C. and the Curie temperature of the ferroelectric material for a time of between 10 seconds and 10 hours. This heat treatment is preferentially performed by exposing the free face 8 of the thin layer 3 to an oxidizing or neutral gaseous atmosphere.

The preparation process also includes, after the heat treatment, thinning of the thin layer 3. This thinning may correspond to polishing of the first free face 8 of the thin layer 3, for example, by means of mechanical polishing, chemical-mechanical polishing and/or chemical etching thinning techniques. It makes it possible to prepare the free face 8 so that it has little roughness, for example, less than 0.5 nm RMS 5×5 μm by atomic force measurement (AFM) and to remove a surface part of the first free face 8 of the thin layer 3 that is liable to contain residual defects.

Needless to say, the present disclosure is not limited to the example described and embodiment variants may be made thereto without departing from the scope of the present disclosure as defined by the claims.

Furthermore, the present disclosure applies to any "heterogeneous" structure in which differences in coefficient of thermal expansion exist between the thin layer 3 and the support substrate 7, for instance, in the case of a silicon on quartz or silicon on sapphire structure.

The invention claimed is:

1. A process for transferring a thin layer comprising a first material onto a support substrate comprising a second material, the first and the second materials having different coefficients of thermal expansion, the process comprising:
    bonding a source substrate to a handle substrate by molecular adhesion, the source substrate comprising the first material, at least a portion of the bonded source substrate and the handle substrate forming a donor substrate comprising an assembly of a thick layer of the first material and a handle substrate, a coefficient of thermal expansion of the handle substrate being similar to that of the support substrate, and the donor substrate having a main face on the thick layer;
    introducing light species into the thick layer to generate an embrittlement plane therein and to define the thin layer between the embrittlement plane and the main face of the donor substrate;
    assembling the main face of the donor substrate with one face of the support substrate; and
    detaching the thin layer from the embrittlement plane, the detachment comprising application of a heat treatment while the thick layer is assembled to and positioned between the handle substrate and the support substrates that have similar coefficients of thermal expansion that are different than the coefficient of thermal expansion of the first material, wherein the coefficient of thermal expansion of the first material of the thick layer and the coefficient of thermal expansion of the second material of the support substrate differ by at least 10% at room temperature.

2. The process of claim 1, wherein a difference in coefficient of thermal expansion of the handle substrate and that the coefficient of thermal expansion of the support substrate is less, as an absolute value, than the difference in coefficient of thermal expansion of the thick layer and the coefficient of thermal expansion of the support substrate.

3. The process of claim 2, wherein the introduced light species comprise hydrogen and/or helium ions.

4. The process of claim 3, wherein the first material comprises a ferroelectric material.

5. The process of claim 4, wherein the first material comprises a ferroelectric material selected from among $LiTaO_3$, $LiNbO_3$, $LiAlO_3$, $BaTiO_3$, $PbZrTiO_3$, $KNbO_3$, $BaZrO_3$, $CaTiO_3$, $PbTiO_3$ and $KTaO_3$.

6. The process of claim 5, wherein the support substrate comprises silicon.

7. The process of claim 6, wherein the handling substrate is of the same composition as the support substrate.

8. The process of claim 1, wherein the handle substrate has a thickness equal to a thickness of the support substrate.

9. The process of claim 1, wherein the thick layer has a thickness of between 10 and 400 micrometers.

10. The process of claim 1, further comprising thinning of the source substrate to provide the thick layer.

11. The process of claim 10, wherein thinning the source substrate comprises at least one process selected from among milling the source substrate, chemical-mechanical polishing of the source substrate, and etching of the source substrate.

12. The process of claim 1, wherein a difference in coefficient of thermal expansion of the handle substrate and that the coefficient of thermal expansion of the support substrate is less, as an absolute value, than the difference in coefficient of thermal expansion of the thick layer and the coefficient of thermal expansion of the support substrate.

13. The process of claim 1, wherein the introduced light species comprise hydrogen and/or helium ions.

14. The process of claim 1, wherein the first material comprises a ferroelectric material.

15. The process of claim 14, wherein the first material comprises a ferroelectric material selected from among $LiTaO_3$, $LiNbO_3$, $LiAlO_3$, $BaTiO_3$, $PbZrTiO_3$, $KNbO_3$, $BaZrO_3$, $CaTiO_3$, $PbTiO_3$ and $KTaO_3$.

16. The process of claim 1, wherein the support substrate comprises silicon.

17. The process of claim 1, wherein the handling substrate is of the same composition as the support substrate.

* * * * *

UNITED STATES PATENT AND TRADEMARK OFFICE
CERTIFICATE OF CORRECTION

| | |
|---|---|
| PATENT NO. | : 11,742,817 B2 |
| APPLICATION NO. | : 16/618696 |
| DATED | : August 29, 2023 |
| INVENTOR(S) | : Isabelle Huyet et al. |

It is certified that error appears in the above-identified patent and that said Letters Patent is hereby corrected as shown below:

On the Title Page

In ITEM (57), ABSTRACT Line 10, change "thick layer introducing" to --thick layer; introducing--

Signed and Sealed this
Sixteenth Day of April, 2024

Katherine Kelly Vidal
*Director of the United States Patent and Trademark Office*